(12) United States Patent
Yoon

(10) Patent No.: US 6,842,060 B2
(45) Date of Patent: Jan. 11, 2005

(54) DIGITAL CONTROL LOGIC CIRCUIT HAVING A CHARACTERISTIC OF TIME HYSTERESIS

(75) Inventor: Sang Sic Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/608,569

(22) Filed: Jun. 30, 2003

(65) Prior Publication Data

US 2004/0124897 A1 Jul. 1, 2004

(30) Foreign Application Priority Data

Dec. 30, 2002 (KR) ................................. 10-2002-0086701

(51) Int. Cl.[7] .............................................. H03K 3/037
(52) U.S. Cl. ....................................................... 327/205
(58) Field of Search ................................ 327/199, 205, 327/211–212, 215–219, 224, 31, 34

(56) References Cited

U.S. PATENT DOCUMENTS

| | | | | |
|---|---|---|---|---|
| 5,594,361 A | * | 1/1997 | Campbell | 326/24 |
| 5,812,002 A | * | 9/1998 | Yoshida | 327/210 |
| 6,060,926 A | * | 5/2000 | Campbell | 327/208 |
| 6,388,488 B1 | * | 5/2002 | Ho | 327/206 |
| 6,433,602 B1 | * | 8/2002 | Lall et al. | 327/205 |

* cited by examiner

*Primary Examiner*—My-Trang Nu ton
(74) *Attorney, Agent, or Firm*—Heller Ehrman White & McAuliffe LLP

(57) ABSTRACT

The present invention discloses a digital control logic circuit having a characteristic of time hysteresis for controlling transition of a digital control signal for a predetermined period, comprising a first time hysteresis unit, a second time hysteresis unit and an inverter. The first time has the characteristic of time hysteresis when an input signal transits from a first level to a second level. The second time hysteresis unit has the characteristic of time hysteresis connected to the first hysteresis in series when the input signal transits from the second level to the first level.

6 Claims, 8 Drawing Sheets

US 6,842,060 B2

DIGITAL CONTROL LOGIC CIRCUIT HAVING A CHARACTERISTIC OF TIME HYSTERESIS

BACKGROUND OF THE INVENTION

1. Field of the Invention

The present invention relates to a control logic circuit having a characteristic of time hysteresis in a semiconductor memory device, and more particularly to a control logic circuit having a characteristic of time hysteresis when the signals transit from "1" to "0" and from "0" to "1" by connecting two time hysteresis circuits in series.

2. Description of the Prior Art

In general, a digital control logic circuit in a semiconductor memory device generates a glitch (short pulse) during delay time as it passes through a delay unit. A time hysteresis circuit is used for eliminating such a glitch.

The time hysteresis circuit has a characteristic of time hysteresis, and the characteristic of time hysteresis controls transition of a digital control signal for a predetermined time when the digital control signal transits from "1" to "0" or from "0" to "1". Such characteristic of time hysteresis may eliminate the glitch possibly generated in an output signal when the input signal transits.

FIG. 1 is a diagram showing a conventional time hysteresis circuit.

The conventional time hysteresis circuit comprises latch 1, delay unit 2 and inverter I1.

The latch 1 comprising two NAND gates ND1 and ND2 receives an input signal A(t) and an output signal from the delay unit 2, and outputs an output signal B(t) after latching for a predetermined time. The inverter I1 inverts the output signal B(t) and the delay unit 2 delays an inversion of the output signal B(t) from the inverter I1 for a delay time "td".

The conventional time hysteresis circuit outputs the output signal B(t) after eliminating the glitch generated when the input signal A(t) transits from "1" to "0". In other words, the delay unit 2 transmits the inversion of the output signal B(t) to the latch 1 after delaying it for the delay time "td". The latch 1 latches the input signal A(t) to "1". However, such characteristic of time hysteresis does not appear when input signal A(t) transits from "0" to "1".

FIG. 2 is a diagram showing waveforms of signals in the conventional time hysteresis circuit.

The time hysteresis circuit in FIG. 2 outputs the output signal B(t) with the glitch eliminated when the input signal A(t) transits from "1" to "0". However, if the input signal A(t) transits from "0" to "1", it will output the output signal B(t) with the glitch not being eliminated.

As a result, the conventional time hysteresis circuit shows a problem to have only one-way characteristic of time hysteresis wherein the input signal A(t) transits from "1" to "0" or from "0" to "1".

SUMMARY OF THE INVENTION

Accordingly, it is an object of the present invention to provide a control logic circuit having a characteristic of time hysteresis when an input signal transits not only from "1" to "0" but also from "0" to "1" by comprising two time hysteresis circuits in series.

It is another object of the present invention to provide a control logic circuit having the characteristic of time hysteresis by comprising a time state machine when the input signal transits from "1" to "0" and/or from "0" to "1".

In an embodiment, there is provided a digital control logic circuit having a characteristic of time hysteresis for controlling transition of a digital control signal for a predetermined period, the digital control logic circuit comprising a first time hysteresis unit, a second time hysteresis unit. The first time has the characteristic of time hysteresis when an input signal transits from a first level to a second level. The second time hysteresis unit connected in series to the first hysteresis has the characteristic of time hysteresis when the input signal transits from the second level to the first level.

DETAILED DESCRIPTION OF THE PREFERRED EMBODIMENTS

Hereinafter, the embodiments of the present invention will be described in detail with reference to the accompanying drawings.

Figure 3:
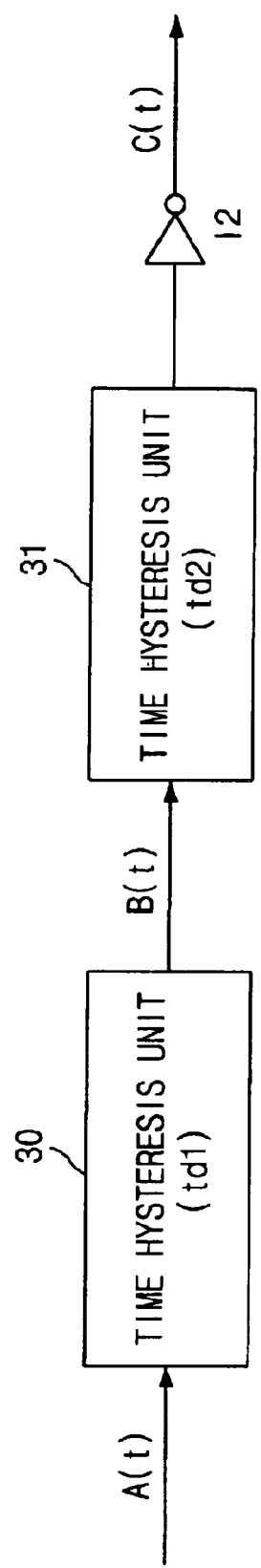
FIG. 3 is a diagram showing the conventional time hysteresis circuit according to a first embodiment of the present invention.

FIG. 3 is a diagram illustrating time hysteresis circuit according to a first embodiment of the present invention. The time hysteresis circuit in FIG. 3 comprises two time hysteresis units 30, 31 connected in series and an inverter I2 to output terminal of the time hysteresis unit 31.

The time hysteresis unit 30 which receives the input signal A(t) delays it for the delay time "td1", and then outputs the output signal B(t). The time hysteresis unit 31 receives the output signal B(t) and delays it for the delay time "td2". The inverter I2 inverts an output signal from the time hysteresis unit 31 and outputs an output signal C(t). According to the status of the output signal C(t), the inverter I2 may be preferably incorporated into the time hysteresis circuit.

Figure 1:
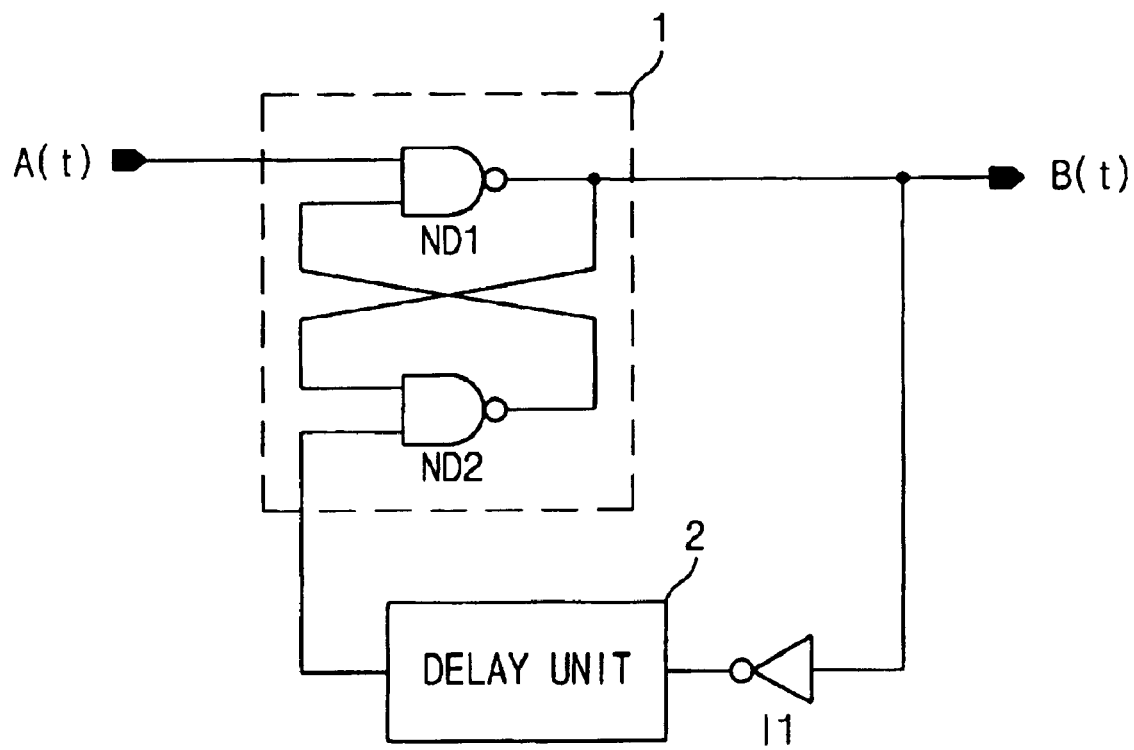
FIG. 1 is a diagram showing a conventional time hysteresis circuit.
Figure 2:
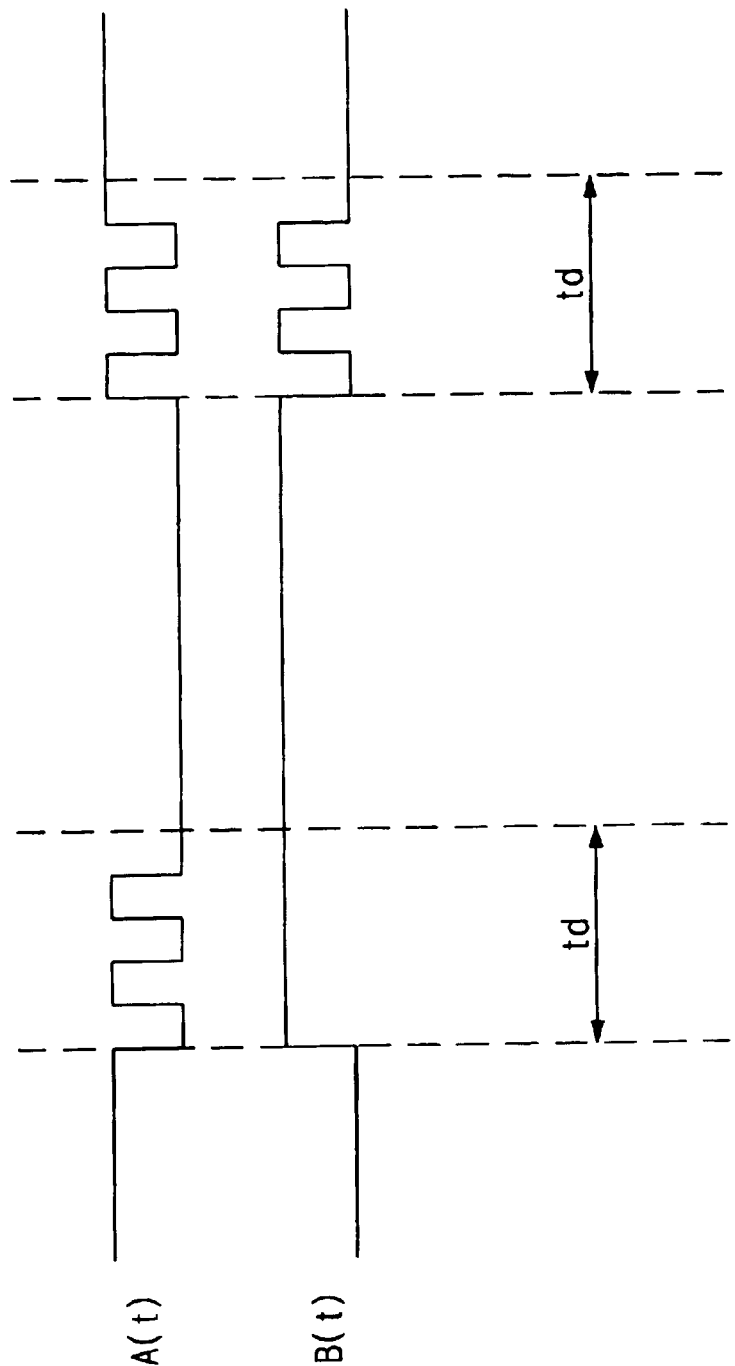
FIG. 2 is a diagram showing waveforms of signals in the conventional time hysteresis circuit.

Here, the internal configurations of the time hysteresis units 30, 31, respectively, may be designed as shown in FIG. 1. Accordingly, the operating relationship will be described in detail without explanation on the internal configurations.

The time hysteresis unit 30 outputs the output signal B(t) after eliminating the glitch generated when the input signal A(t) transits from "1" to "0", and the time hysteresis unit 31 outputs the output signal C(t) after eliminating the glitch generated when the input signal A(t) transits from "0" to "1".

There are two cases when the input signal A(t) transits from "1" to "0" and when the input signal A(t) transits from "0" to "1". When the input signal A(t)" transits from "1" to "0", the glitch may be first eliminated by the time hysteresis unit 30.

However, additional glitches can be generated when B(t) transits from "1" to "0" during the delay time of "td1" in the time hysteresis unit 30. In order to eliminate the glitches additionally generated when the output signal B(t) transits from "1" to "0", the time hysteresis unit 31 should be connected to output terminal of the time hysteresis unit 30.

If the input signal A(t) transits from "0" to "1", the delay time "td2" should be longer than delay time "td1" such that the time hysteresis unit 31 may eliminate glitches delayed for the delay time "td1" of the output signal B(t).

In other words, it is desirable that delay time "td2" of the time hysteresis unit 31 be longer than the delay time "td1" of time hysteresis unit 30, and preferably, double the delay time "td1".

As described above, the present invention has a characteristic of bi-directional time hysteresis, wherein the time hysteresis unit 30 and the time hysteresis unit 31 are connected in series such that the time hysteresis unit 30 eliminates the glitch generated when the input signal A(t) transits from "1" to "0", and the time hysteresis unit 31 eliminates the glitch generated when the input signal A(t) transits from "0" to "1".

Figure 4:
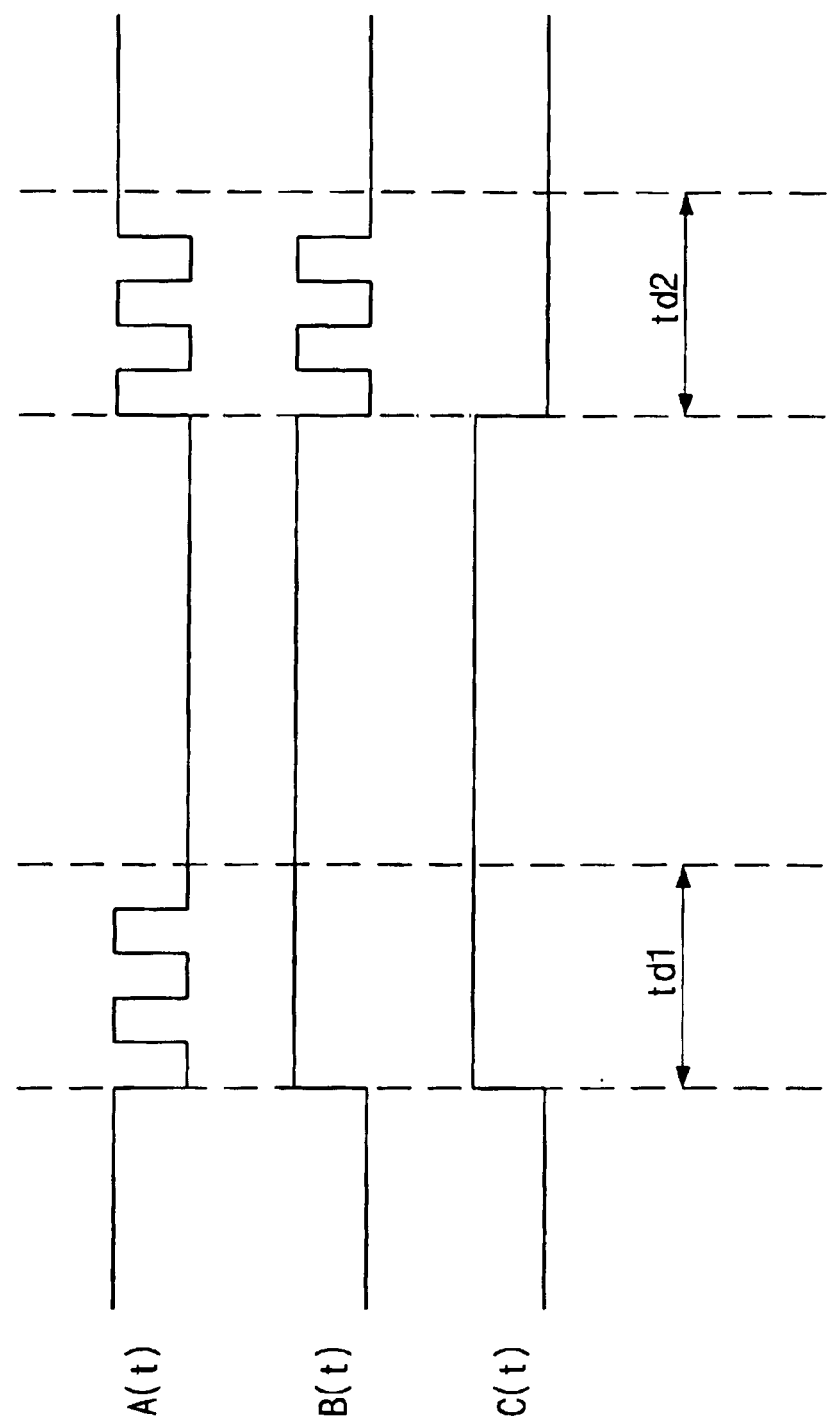
FIG. 4 is a diagram showing waveforms of signals in time hysteresis circuit in FIG. 3.

FIG. 4 is a diagram illustrating waveforms of signals in FIG. 3.

As previously explained, when the input signal A(t) transits from "1" to "0", the output signal B(t) is output after the glitch is eliminated by time hysteresis unit 30.

When the input signal A(t) transits from "0" to "1", the time hysteresis unit 31 outputs the output signal C(t) wherein the glitch is eliminated.

As a result, it can be achieved in the present invention to output the output signal C(t) without any glitch for both cases when the input signal A(t) transits from "1" to "0" and when the input signal A(t) transits from "0" to "1".

Figure 5:
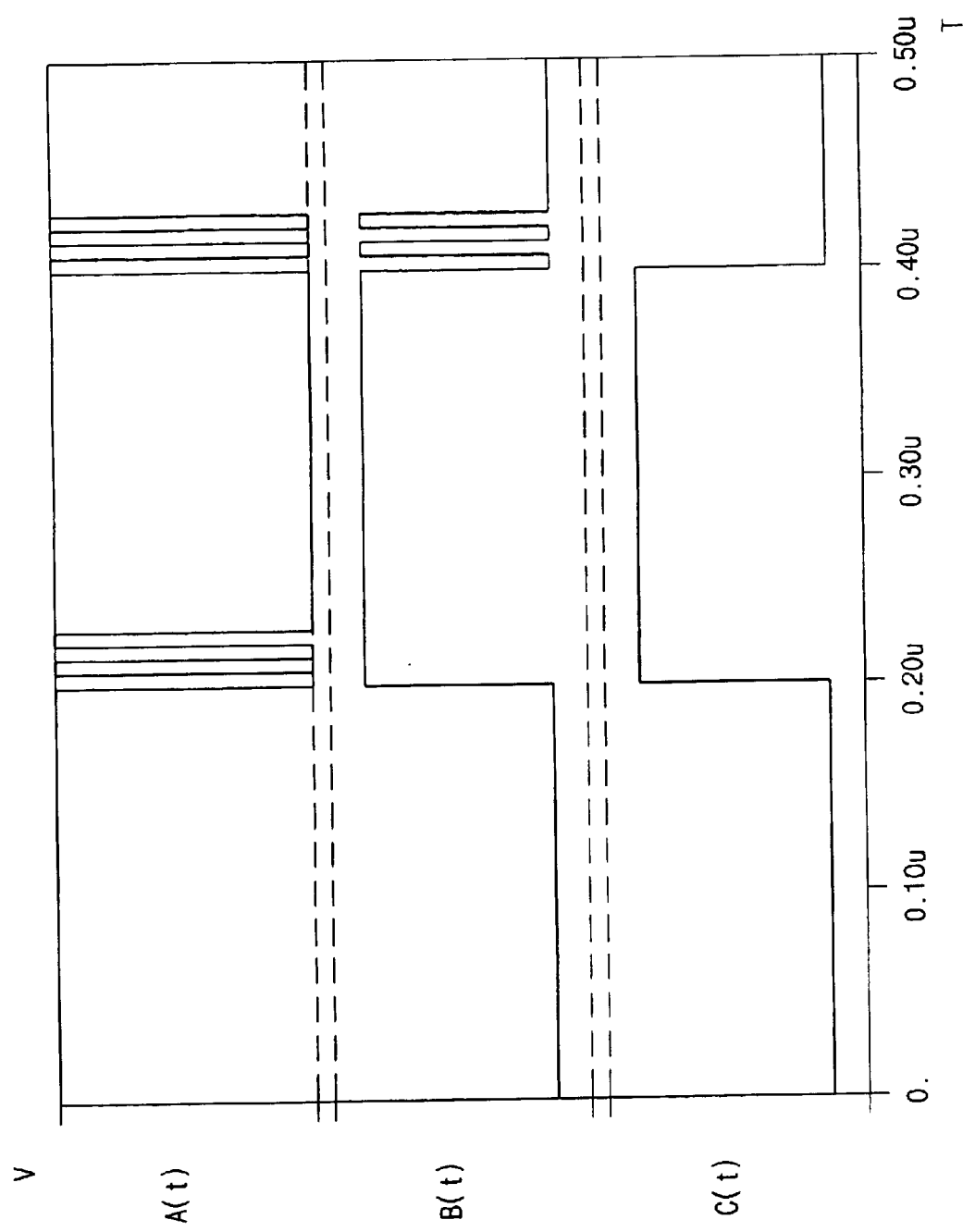
FIG. 5 is a simulation diagram according to time hysteresis circuit in FIG. 3.

FIG. 5 is a graph illustrating the result of simulation of time hysteresis circuits in FIG. 3. It can be seen that the result of the real simulation is the same as that of FIG. 4.

Figure 6:
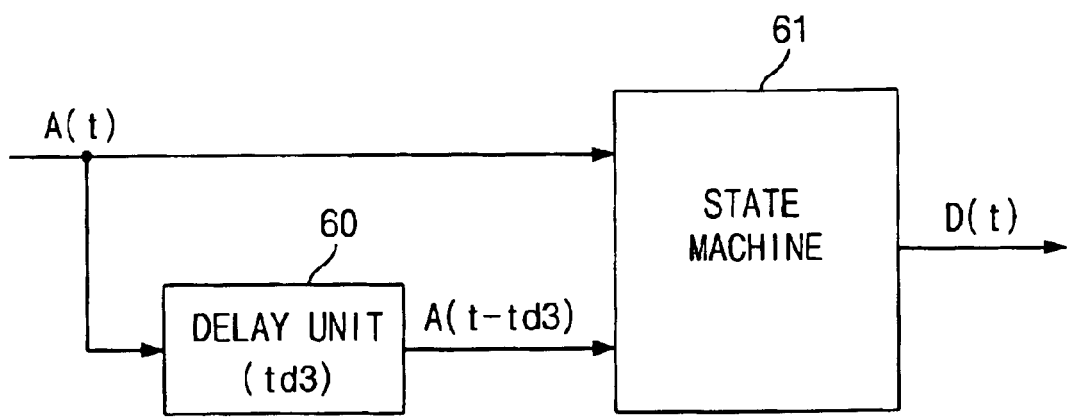
FIG. 6 is a diagram showing time hysteresis circuit according to a second embodiment of the present invention.

FIG. 6 is a diagram illustrating time hysteresis circuit according a second embodiment of the present invention.

The time hysteresis circuit comprising delay unit 60 and state machine 61 receives the input signal A(t) and outputs an output signal D(t).

The delay unit 60 delays the input signal A(t) for the delay time "td3", and outputs the delayed signal A(t-td3).

The state machine 61 receives the input signal A(t) and the delayed signal A(t-td3) from the delay unit 60, and output the out put signal D(t). At this time, the state machine 61 changes the state according to the transition of the input signal A(t) and the delayed signal A(t-td3).

The state machine 61 is desirable to be configured with two SR-latches (not shown) or to be embodied with two D-flip flops (not shown).

Figure 7:
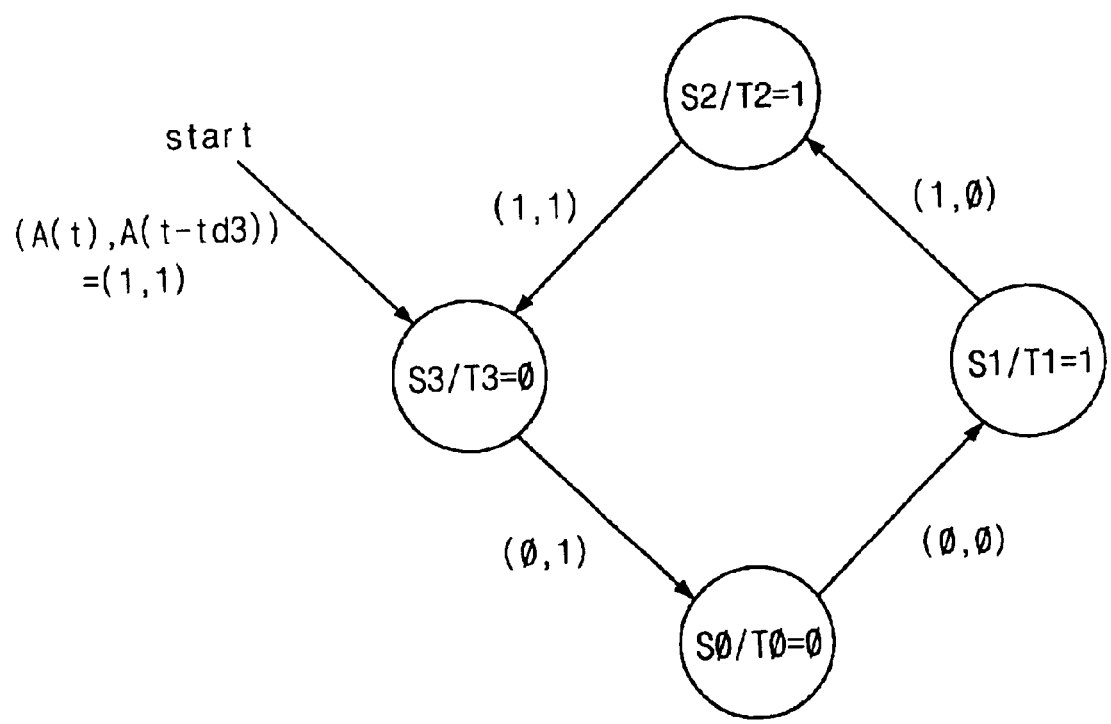
FIG. 7 illustrates the operation of a state machine in FIG. 6.

FIG. 7 is a diagram for illustrating the operation of the state machine 61 In FIG. 6.

The state machine 61 uses two input signals A(t), A(t-td3) and has four states S0, S1, S3, S3.

The State machine 61 transits from an initial state S3 to state S0 outputting T0 value when the input signal A(t) transits from "1" to "0". Then, the state machine 61 transits from state S0 to state S1 outputting T1 value at the moment when the delayed signal A(t-td3) becomes "0" from "1".

Thereafter, the state machine 61 transits from state S1 to state S2 outputting T2 value when the input signal A(t) transits from "0" to "1". Finally, the state machine 61 transits to from state S2 to state S3 outputting T3 value when the delayed signal A(t-td3) transits from "0" to "1".

As described above, the state machine 61 may adjust the values T0~T3 to output any desired the output D(t). That is to say, a circuit may be embodied which has various characteristic of hysteresis by changing the output values of the state machine 61.

Figure 8:
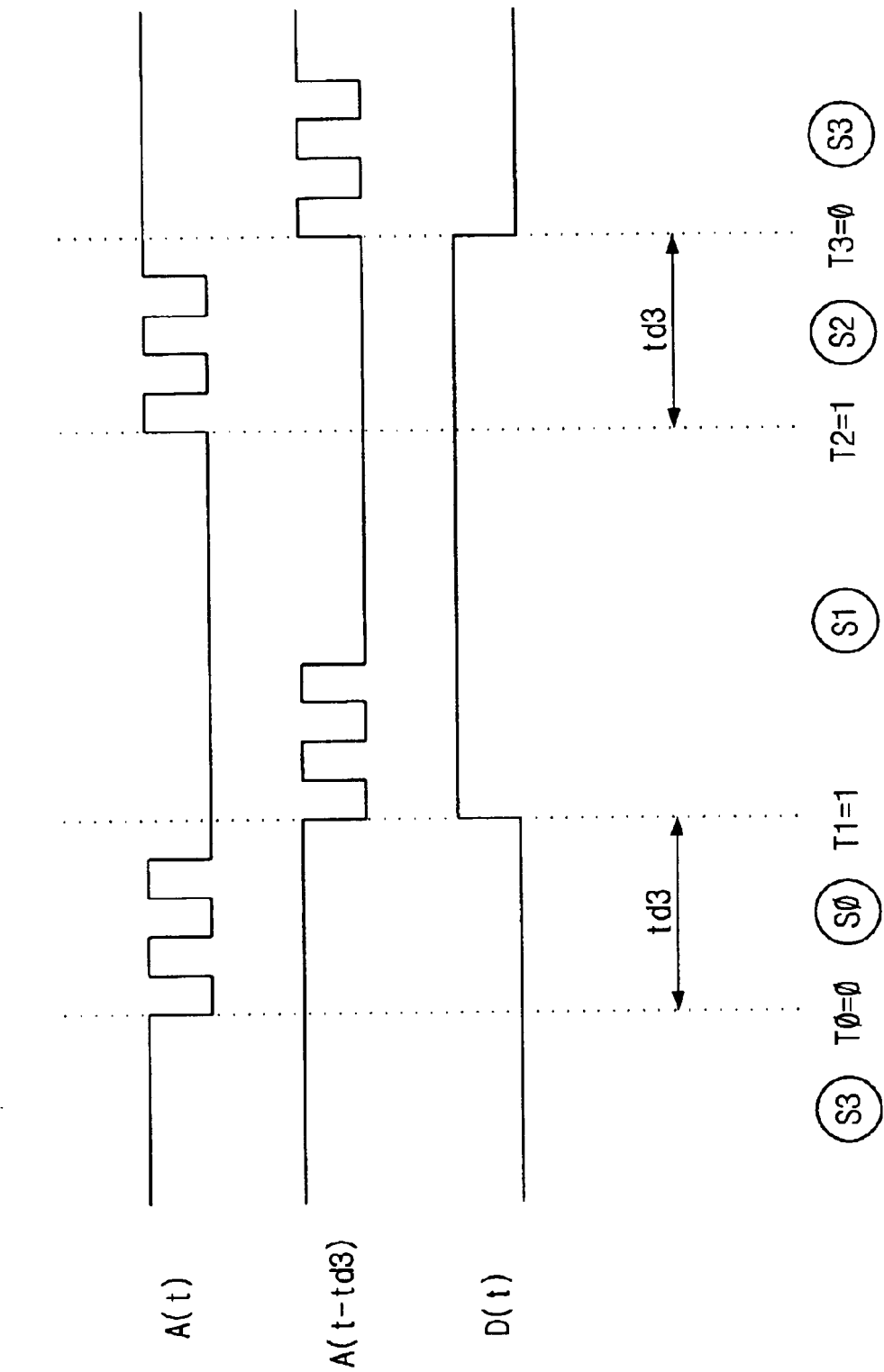
FIG. 8 is a diagram showing waveforms of signals according to time hysteresis circuit in FIG. 6.

FIG. 8 illustrates examples when the output values of state machine are T0=0, T1=1, T2=1 and T3=0.

When the input signal A(t) transits from "1" to "0" or from "0" to "1", the glitch may be generated. The delay signal A(t-td3) is delayed as much as "td3", and thus the glitch is generated the same as generated in the input signal A(t).

The output signal D(t) has an opposite status to the input signal A(t) and is output without glitches generated when the input signal A(t) transits from "1" to "0" of from "0", to "1".

Accordingly, the present invention may eliminate glitches generated from transition of digital control signals as much as possible.

As discussed earlier, a digital control logic circuit having a characteristic of time hysteresis according to the present invention has an advantage of minimizing glitches generated from both transitional periods when the digital control signal transits from "1" to "0" and when it transits from "0" to "1".

In addition, it has an advantage to embody a circuit having various characteristics of hysterisises by comprising a state machine.

What is claimed is:

1. A digital control logic circuit having a characteristic of time hysteresis for controlling transition of a digital control signal during a predetermined period, comprising:

a first time hysteresis unit having a characteristic of time hysteresis by latching an input signal for predetermined time of a first delay when an input signal transits from a first level to a second level; and a second time hysteresis unit connected in series to the first time hysteresis unit having a characteristic of time hysteresis by latching the input signal for predetermined time of a second delay longer than the first delay when the input signal transits from the second level to the first level.

2. The circuit according to claim 1, further comprising an inverter for inverting an output signal from said second time hysteresis unit.

3. The circuit according to claim 1, wherein the first time hysteresis unit comprises:

a latch unit for maintaining an output signal at a predetermined level;

an inverter for inverting the output signal from the latch unit; and a first delay unit connected to the latch unit in a feedback structure, which delays an output signal from the inverter for predetermined time of the first delay.

4. The circuit according to claim 3, wherein the second time hysteresis unit comprises:

a latch unit maintaining an output signal at a predetermined level;

an inverter for inverting the output signal from the latch unit; and a second delay unit connected to the latch unit in a feedback structure, which delays an output signal from the inverter for predetermined time of the second delay.

5. The circuit according to claim 4, wherein the second delay time is more than two times longer than the first delay time.

6. The circuit according to claim 1, wherein the second delay time is more than two times longer than the first delay time.

* * * * *